(12) United States Patent
Hwang et al.

(10) Patent No.: US 8,028,653 B2
(45) Date of Patent: Oct. 4, 2011

(54) SYSTEM, METHOD AND APPARATUS FOR FILAMENT AND SUPPORT USED IN PLASMA-ENHANCED CHEMICAL VAPOR DEPOSITION FOR REDUCING CARBON VOIDS ON MEDIA DISKS IN DISK DRIVES

(75) Inventors: Eric Hwang, San Francisco, CA (US); Jinliu Wang, San Jose, CA (US); Richard Longstreth White, Los Altos, CA (US)

(73) Assignee: Hitachi Global Storage Technologies Netherlands, B.V., Amsterdam (NL)

( * ) Notice: Subject to any disclaimer, the term of this patent is extended or adjusted under 35 U.S.C. 154(b) by 970 days.

(21) Appl. No.: 11/951,649

(22) Filed: Dec. 6, 2007

(65) Prior Publication Data
US 2009/0148626 A1  Jun. 11, 2009

(51) Int. Cl.
| | |
|---|---|
| C23C 16/00 | (2006.01) |
| A21B 1/00 | (2006.01) |
| A21B 1/22 | (2006.01) |
| H05B 1/02 | (2006.01) |
| H01G 5/01 | (2006.01) |
| H01G 5/38 | (2006.01) |
| H01G 5/06 | (2006.01) |
| H01G 4/228 | (2006.01) |
| H01G 9/10 | (2006.01) |
| H02B 1/00 | (2006.01) |
| H01R 9/00 | (2006.01) |
| H05K 5/03 | (2006.01) |

(52) U.S. Cl. .......... 118/723 E; 219/411; 219/391; 219/496; 361/278; 361/299.2; 361/298.4; 361/306.1; 361/309; 361/669; 361/823; 361/520; 361/538; 361/540

(58) Field of Classification Search ............ 118/723 E; 219/391, 496, 411; 361/278, 299.2, 298.4, 361/306.1, 309, 669, 823, 520, 538, 540
See application file for complete search history.

(56) References Cited

U.S. PATENT DOCUMENTS

| | | | |
|---|---|---|---|
| 4,264,843 | A | 4/1981 | Hammersand |
| 4,684,204 | A | 8/1987 | Johnson et al. |
| 6,039,849 | A | 3/2000 | Paulson et al. |
| 6,101,972 | A | 8/2000 | Bluck et al. |
| 6,203,862 | B1 | 3/2001 | Bluck et al. |
| 6,846,205 | B1 | 1/2005 | Grow |
| 2007/0137063 | A1 | 6/2007 | Grubbs et al. |

FOREIGN PATENT DOCUMENTS

| | | |
|---|---|---|
| JP | 61270367 | 11/1986 |
| JP | 3015138 | 1/1991 |
| JP | 9017346 | 1/1997 |
| JP | 10018027 | 1/1998 |
| JP | 2001357791 | 12/2001 |
| JP | 2003317640 | 11/2003 |
| JP | 2004091836 | 3/2004 |
| KR | 2005077169 A | 8/2005 |
| KR | 2006092354 A | 8/2006 |
| WO | 9323868 | 11/1993 |

*Primary Examiner* — Keath Chen

(57) ABSTRACT

A filament post used in plasma-enhanced chemical vapor deposition has an outer shell and an inner post. An electrical potential is applied only to the inner post to ensure that there is no impact on the plasma density and the carbon film properties. The inner post and the outer shell are electrically insulated by ceramic insulators, such that no electrical potential is applied to outer shell. The stress generated in the carbon film is directly related to the electrical potential of the surface to which the film is deposited. The carbon film deposited on the outer shell of the post is not highly stressed, which significantly reduces film delamination from the filament post surfaces.

6 Claims, 6 Drawing Sheets

SYSTEM, METHOD AND APPARATUS FOR FILAMENT AND SUPPORT USED IN PLASMA-ENHANCED CHEMICAL VAPOR DEPOSITION FOR REDUCING CARBON VOIDS ON MEDIA DISKS IN DISK DRIVES

BACKGROUND OF THE INVENTION

1. Technical Field

The present invention relates in general to plasma enhanced chemical vapor deposition processes and, in particular, to an improved system, method, and apparatus for depositing a thin film carbon overcoat with a filament that reduces the occurrence of carbon voids on magnetic media disks in hard disk drives.

2. Description of the Related Art

The use of thin film carbon overcoats on magnetic media disks in hard disk drives have several advantages. The overcoats provide corrosion protection, scratch and wear resistance, and a surface to which lubricant film may bond. The rapid increase in magnetic recording areal densities in disk drives has required smaller magnetic spacing between the read/write heads and the disks. In turn, smaller magnetic spacing require an even thinner film overcoat. However, in order for a thin overcoat to maintain sufficient corrosion and mechanical robustness, the density of the carbon overcoat must be increased to compensate for the loss in thickness.

Dense overcoat films may be formed with plasma-enhanced chemical vapor deposition (PECVD). The overcoat is deposited on workpieces from a sputter chamber and is accumulated to form the necessary film thickness after multiple deposition cycles. Unfortunately, PECVD thin film carbon is highly stressed after it is deposited and tends to delaminate from the manufacturing hardware surfaces. The delaminated film produces contamination in the form of undesirable carbon flakes and particles that are unintentionally deposited on the hard disk surfaces. Although the particles can be removed with post-processing manufacturing techniques (e.g., tape cleaning), such techniques indiscriminately also remove the overcoat itself, which leaves small areas on the disk surfaces without overcoat protection. These imperfections in the overcoat are also known as carbon voids. When disk drives are operated in corrosive conditions, such as high temperature, high humidity and repeated condensation cycles, the carbon voids can cause hard disk drive failure.

In the prior art, the filament posts used to support the filament for thin film deposition were observed to be a significant source for generating the unwanted carbon particles and carbon voids. For example, prior art designs for filaments used to deposit PECVD thin film overcoats are disclosed in U.S. Pat. Nos. 6,203,862 and 6,101,972, which are incorporated herein by reference.

In those designs, a tungsten filament 10 (FIG. 1) is used to generate thermal electrons that interact with a gas precursor (e.g., acetylene) to create a plasma. The tungsten filament 10 is mounted between a pair of electrodes 11 (one shown in FIG. 1). A negative potential or bias 17 is typically applied to the filament and filament post. The intent of the bias is to accelerate electrons away from the filament and enhance the ionization of the working gas. An incidental and undesirable effect is the deposition of highly stressed carbon films on the filament post surface.

Unfortunately, this technique has an inherent tendency to produce high intrinsic stress in the thin film deposited on the electrodes 11. After repeated deposition cycles, the highly-stressed carbon film tends to accumulate on the electrodes. When the film reaches a critical thickness on the electrodes, the film tends to delaminate from the surfaces of the electrodes, which produces the unwanted carbon particles and carbon voids described above. Although this prior art design is workable, an improved solution for forming thin film overcoats that addresses the limitations of the prior art would be desirable.

SUMMARY OF THE INVENTION

Embodiments of a system, method, and apparatus for an improved electrode design that may be used in a PECVD sputter system are disclosed. This design significantly reduces the number of carbon voids formed on disks compared to conventional techniques. Reducing the carbon void level is important for improving the corrosion robustness and overall quality of the magnetic media. The design of the present invention utilizes filament posts that result in reduced deposition stress on the surfaces of the posts. With a reduction in stress, there is a smaller tendency to generate carbon particles.

In one embodiment, the electrode comprises two components, including an outer shell and a filament support or inner post. An electrical potential is applied only to the inner post to ensure that there is no impact on the plasma density and the carbon film properties. In one embodiment, the inner post and the outer shell are electrically insulated from each other by a ceramic insulator. As a result, no electrical potential is applied to the outer shell of the electrode. The stress generated in the carbon film is directly related to the electrical potential of the surface on which the film is deposited. Consequently, the carbon film deposited on the outer shell of the post is not highly stressed since the outer shell is insulated, which significantly reduces the driving force for film delamination from the filament support surfaces. Thus, for a fixed number of deposition cycles at a fixed deposition rate, the probability of generating carbon particles and carbon voids is significantly reduced.

The foregoing and other objects and advantages of the present invention will be apparent to those skilled in the art, in view of the following detailed description of the present invention, taken in conjunction with the appended claims and the accompanying drawings.

BRIEF DESCRIPTION OF THE DRAWINGS

So that the manner in which the features and advantages of the present invention, which will become apparent, are attained and can be understood in more detail, more particular description of the invention briefly summarized above may be had by reference to the embodiments thereof that are illustrated in the appended drawings which form a part of this specification. It is to be noted, however, that the drawings illustrate only some embodiments of the invention and therefore are not to be considered limiting of its scope as the invention may admit to other equally effective embodiments.

DETAILED DESCRIPTION OF THE INVENTION

Figure 1:
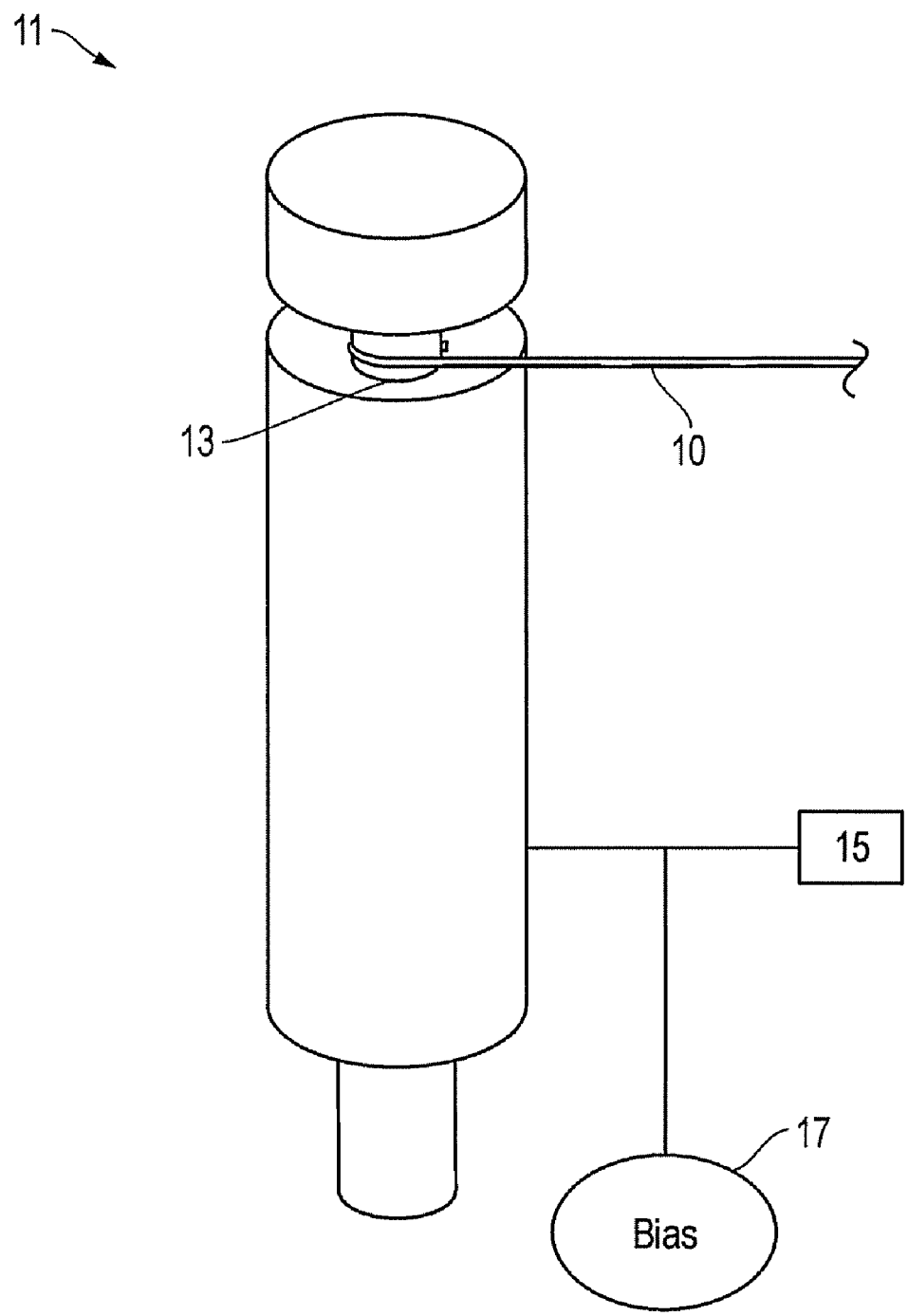
FIG. 1 is a schematic diagram of a conventional electrode using for film deposition.
Figure 2:
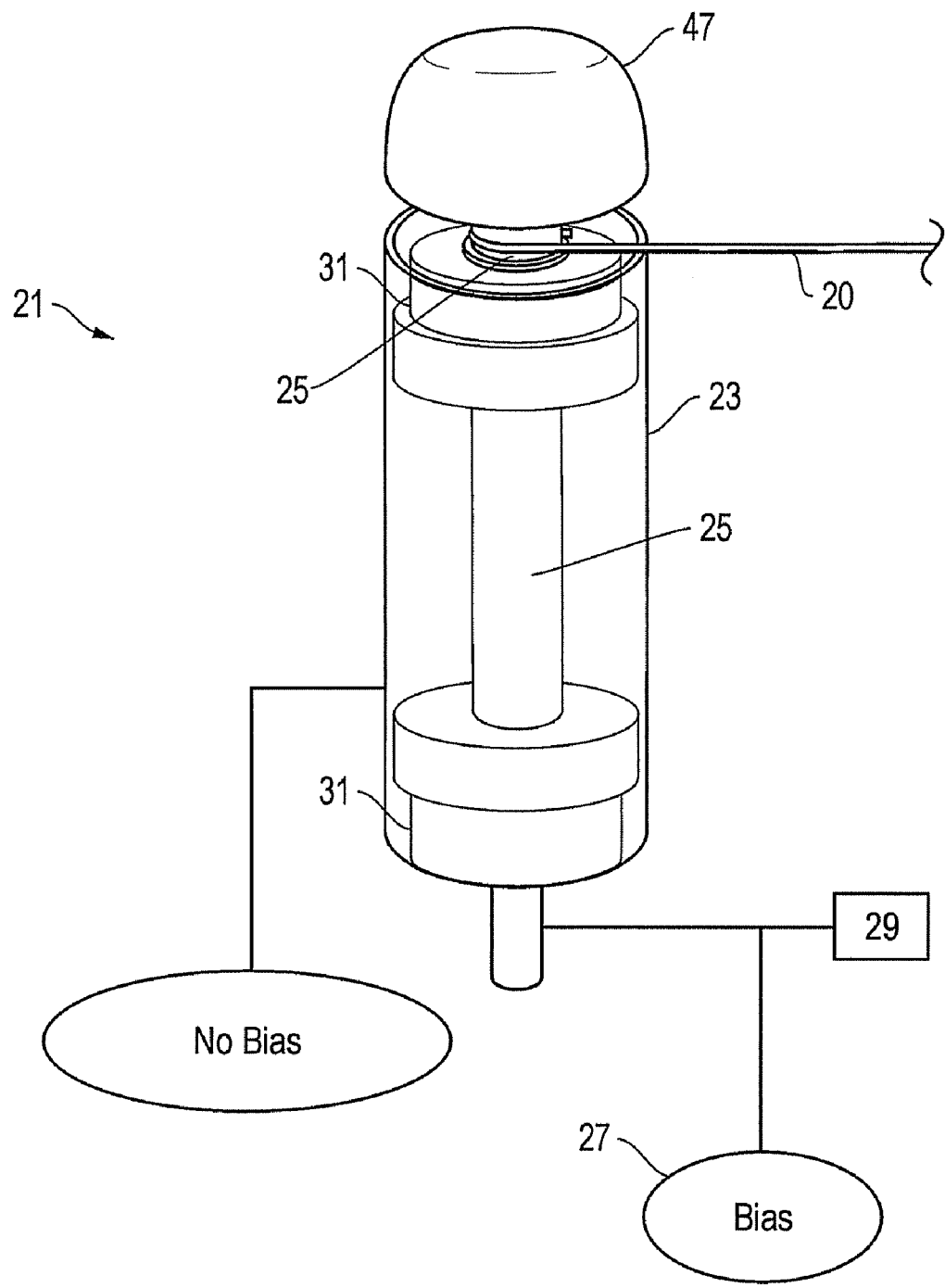
FIG. 2 is a schematic diagram of one embodiment of an electrode for film deposition and is constructed in accordance with the invention.
Figure 5:
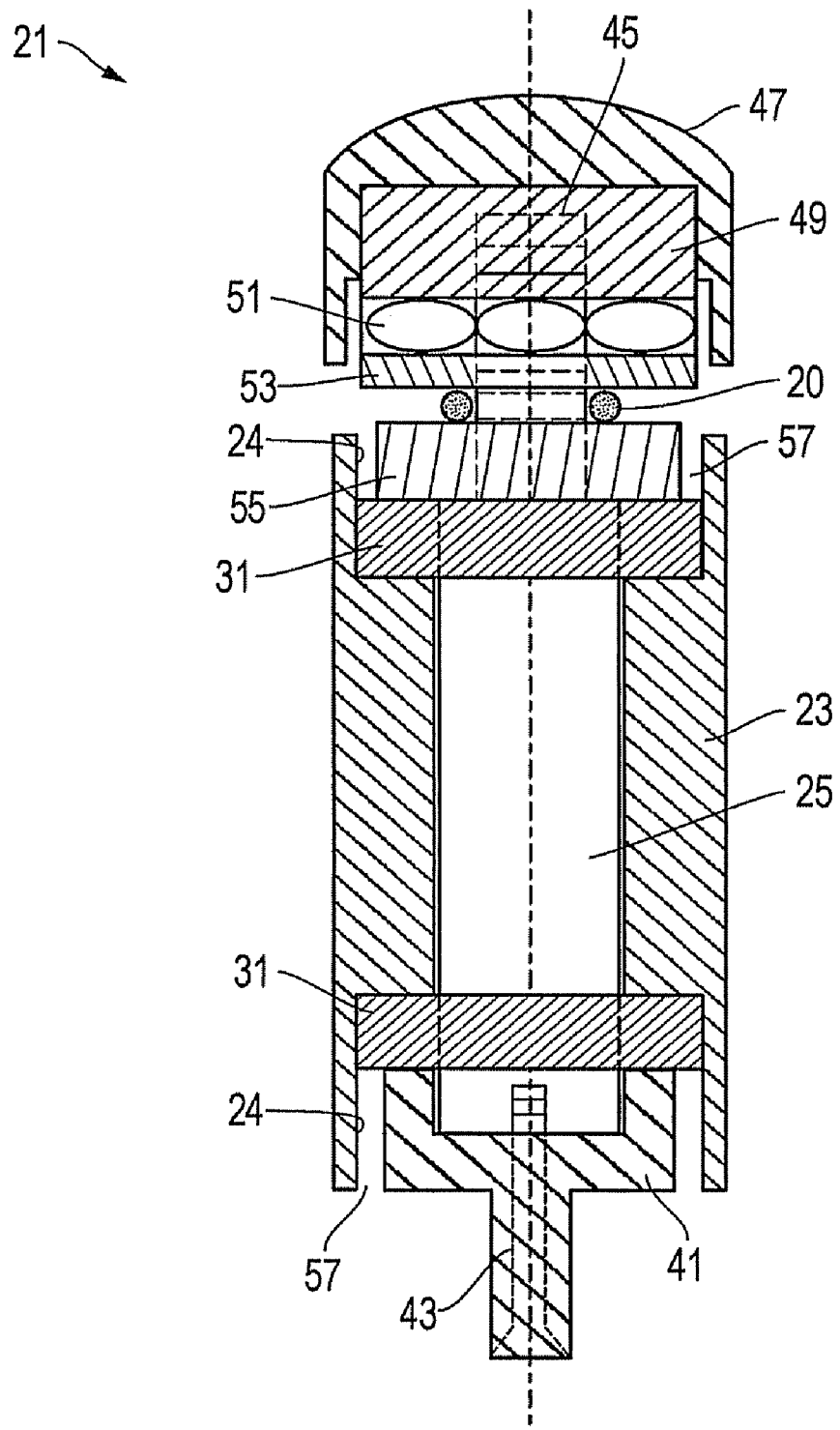
FIG. 5 is a sectional side view of the electrode of FIG. 2 and is constructed in accordance with the invention.

Referring to FIGS. 2 and 5, one embodiment of a system, method and apparatus for an improved electrode design that may be used in a PECVD sputter system is shown. The electrode or filament support 21 comprises an outer shell 23 and an inner post 25 for supporting a filament 20. An electrical potential 27 is applied only to the inner post 25 and the workpiece 29 (e.g., a magnetic media disk) to ensure that there is no impact on the plasma density and the carbon film properties.

The inner post 25 and the outer shell 23 are electrically insulated from each other (e.g., at greater than approximately 50 ohms). For example, two ceramic insulators 31 may be located at opposite ends of the outer shell 23 and prevent outer shell 23 from contacting the other electrically conductive components. There is no electrical potential applied to the outer shell 23 of the electrode 21. In the embodiment shown, the outer shell 23 has a cylindrical pocket 24 formed on each axial end for accommodating the insulators 31.

In the embodiment shown, the assembly of electrode 21 may further comprise a lock disk 41 (FIG. 5) secured to a proximal end of inner post 25 with a screw 43. The inner post 25 has a threaded distal end 45 to which may be joined to a cap 47, a ceramic insert 49, a lock nut 51, and a washer 53 adjacent to the filament 20. Thus, cap 47 also is electrically insulated from inner post 25, just like outer shell 23. The ceramic insert 49 may be cylindrical in shape, have a tapped hole for engaging the threaded distal end 45, and have a metal outer surface covering that is bonded or otherwise joined to cap 47.

A collar 55 is located on the other side of filament 20, opposite washer 53, and secures the sub-assembly of ceramic insulators 31 and outer shell 23 to the inner post 25. As shown in this embodiment, the ceramic insulators 31 have a diameter that is greater than a diameter of collar 55 and lock disk 41, such that a small radial gap 57 extends between and annularly circumscribes the outer shell 23 and both the collar 55 and the lock disk 41.

Figure 6:
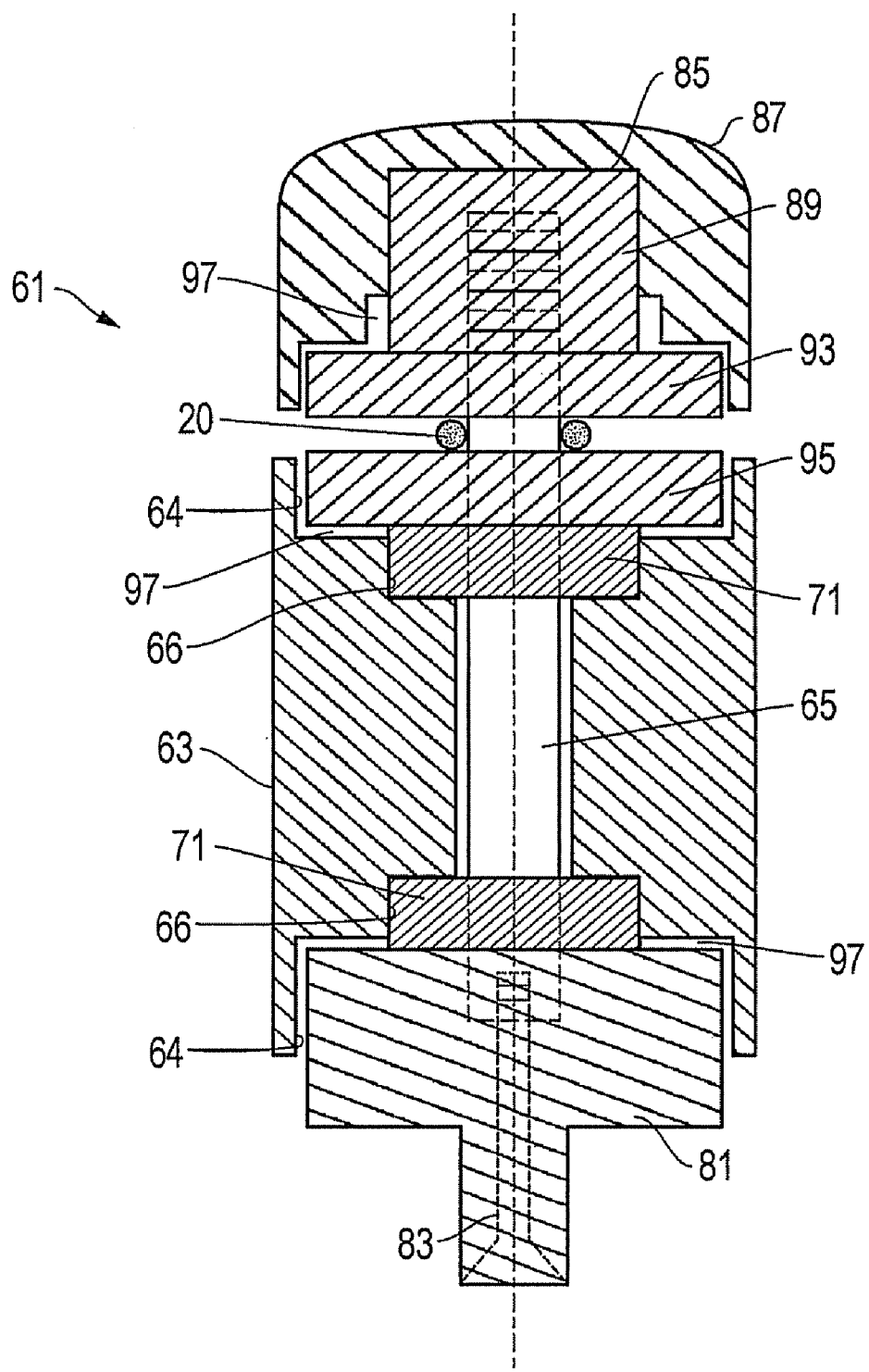
FIG. 6 is a sectional side view of another embodiment of an electrode constructed in accordance with the invention.

Referring now to FIG. 6, another embodiment of an electrode or filament support 61 comprises an outer shell 63 and an inner post 65 for supporting a filament 20. The inner post 65 and the outer shell 63 are electrically insulated from each other (e.g., at greater than approximately 50 ohms) by one or more (e.g., two shown) ceramic insulators 71. The insulators 71 prevent outer shell 63 from contacting the other electrically conductive components. There is no electrical potential applied to the outer shell 63 of the electrode 61. In the embodiment shown, the outer shell 63 has a pair of stepped, cylindrical pockets 64, 66 formed on each axial end for accommodating the insulators 31, and collar 55/disk 41.

In the embodiment shown, the assembly of electrode 61 may further comprise a lock disk 81 secured to a proximal end of inner post 65 with a screw 83. The inner post 65 has a threaded distal end 85 to which may be joined a cap 87, a ceramic insert 89, and a washer 93 adjacent to the filament 20. Thus, cap 87 also is electrically insulated from inner post 65, just like outer shell 63. Another collar 95 is located on the other side of filament 20, opposite washer 93, and secures the sub-assembly of ceramic insulators 61 and outer shell 63 to the inner post 65. As shown in this embodiment, the ceramic insulators 61 have a diameter that is less than a diameter of collar 95 and lock disk 81, such that a narrow labyrinthine gap 97 extends between the outer shell 63, collar 95, lock disk 81, and insulators 61. The path defined by gap 97 helps to avoid coating the radial edges of the insulators. Such coatings can electrically short both the cap and the outer shell to the inner post.

In operation, the stress generated in the deposited carbon film is directly related to the electrical potential of the surface on which the film is deposited. The carbon film deposited on the outer shell 23 of the electrode 21 is not highly stressed since the outer shell is electrically insulated. This significantly reduces the driving force of film delamination from the filament post surfaces. Thus, for a fixed number of deposition cycles at a fixed deposition rate, the probability of generating carbon particles and carbon voids is significantly reduced.

This design significantly reduces (e.g., by approximately 40%) the stress in the carbon film deposited on the outer shells and, thus, the number of carbon voids formed on disks compared to conventional techniques. Reducing the carbon void level is important for improving the corrosion robustness and overall quality of the magnetic media. The design of the present invention utilizes filament posts that result in reduced deposition stress on the surfaces of the posts. With a reduction in stress, there is a smaller tendency to generate carbon particles.

The invention also comprises a magnetic media disk having a novel, very low probability of voids and defects that was previously unachievable through prior art techniques. In one embodiment, the invention provides a disk having substantially zero voids and defects as described herein.

Figure 3:
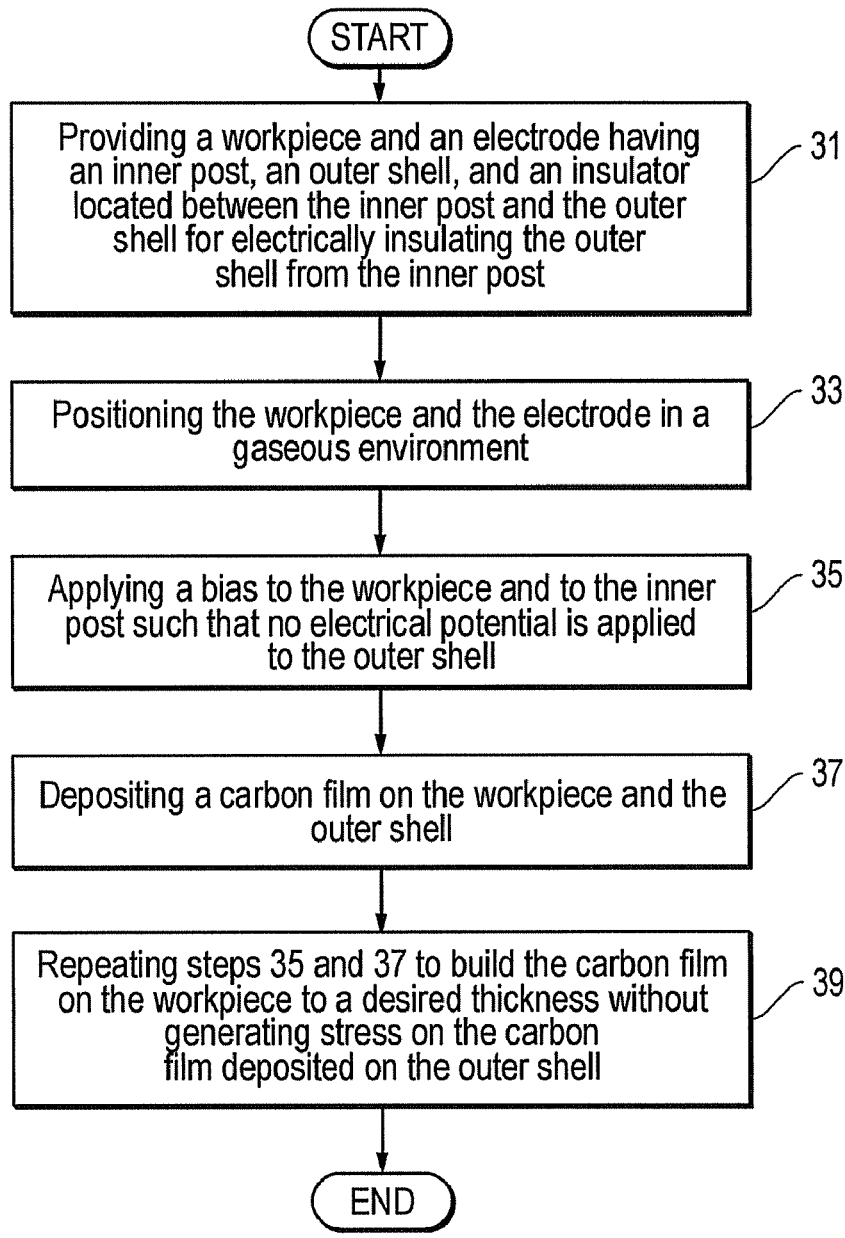
FIG. 3 is a high level flow diagram of one embodiment of a method constructed in accordance with the invention.

The invention further comprises a method of performing PECVD. One embodiment of the method begins as indicated in FIG. 3, and comprises providing a workpiece and an electrode having an inner post, an outer shell, and an insulator located between the inner post and the outer shell for electrically insulating the outer shell from the inner post (step 31); positioning the workpiece and the electrode in a gaseous environment (step 33); applying a bias to the workpiece and to the inner post such that no electrical potential is applied to the outer shell (step 35); depositing a carbon film on the workpiece and the outer shell (step 37); repeating steps 35 and 37 to build the carbon film on the workpiece to a desired thickness without generating significant stress on the carbon film deposited on the outer shell (step 39); before ending as indicated.

In an alternate embodiment, the method comprises providing the insulator as a pair of ceramic insulators located at opposite ends of the outer shell, and the inner post comprises a tungsten filament.

Figure 4:
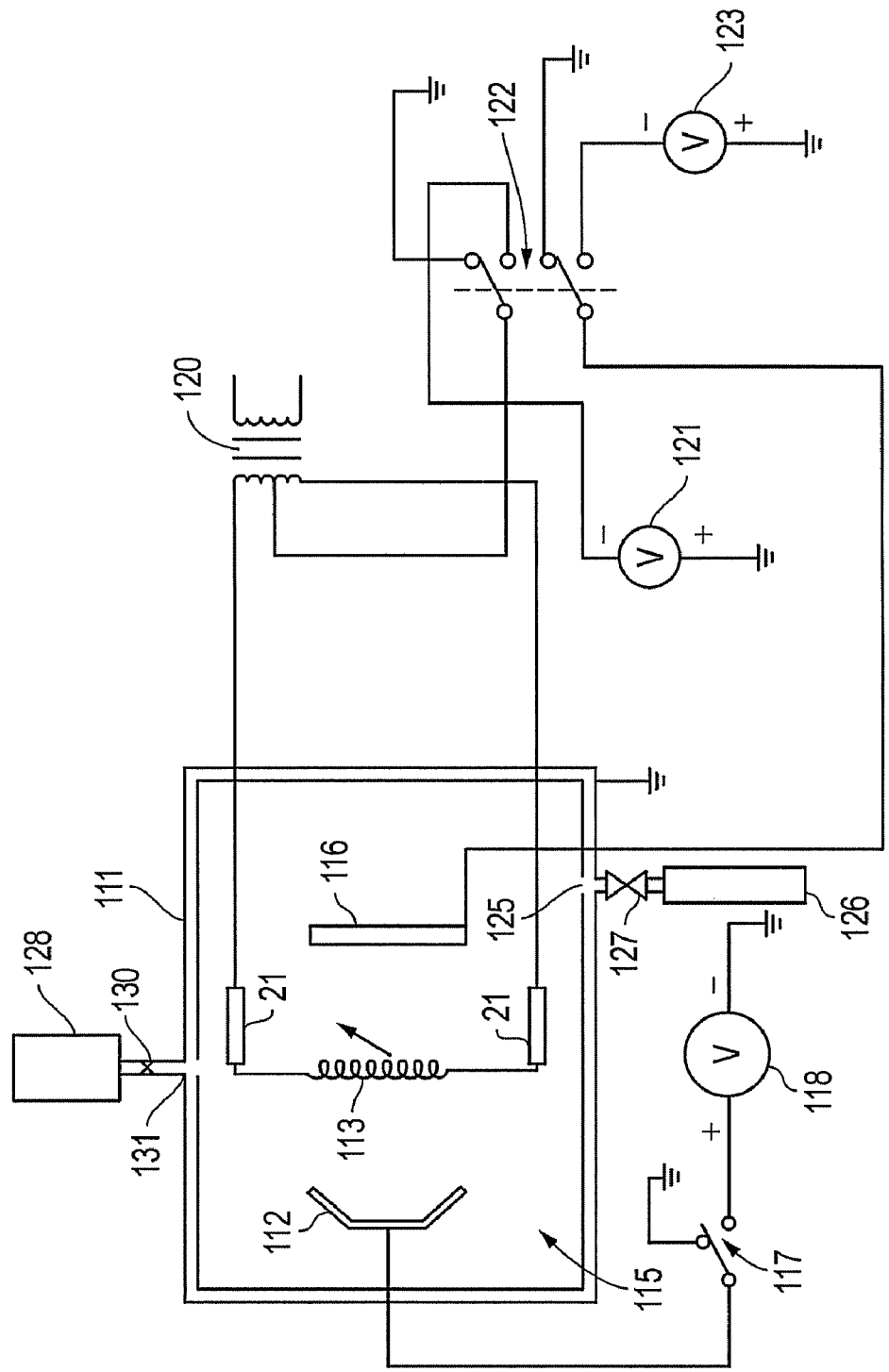
FIG. 4 is a schematic drawing of one embodiment of a deposition system constructed in accordance with the invention.

Referring now to FIG. 4, one embodiment of a system for depositing materials on a workpiece that utilizes the previously described filament post is disclosed. In the illustrated embodiment, a grounded chamber 111 houses an anode 112 and a filament 113. The filament 113 is supported by a pair of supports or electrodes 21 as described herein. The combination of filament 113 and anode 112 together comprise an ion source generally shown as 115. Positioned also within chamber 111 is a workpiece 116 that faces the ion source 115. The anode 112 is connected through an anode switch 117 to a grounded anode power supply 118.

Connected to the filament 113 is a filament power supply 120. A filament bias supply 121 is connected through a bias switch 122 through the filament power supply 120 to the filament 113. In the embodiment shown, the bias supply 121 biases the filament 113 at ground. When bias switch 122 is thrown to its other position, filament 113 is biased from filament bias supply 121. The workpiece 116 is biased from workpiece bias supply 123 when bias switch 122 (ganged to close circuits to each of the filament 113 and the workpiece 116 or, alternatively, to a workpiece holder on which workpiece 116 is positioned) is thrown to its other position.

In operation the chamber walls remain grounded, which assures that the equipment does not become dangerous in its natural environment. When it is desired to operate the equipment, switches 117 and 122 are closed to connect the filament 113 to a bias potential and to connect the anode 112 to a bias potential. With the switches placed in this other positions voltage is supplied to the anode 112 from anode power supply 118 and to filament 113 from filament bias supply 121 through filament power supply 120. The anode when biased is raised to a positive voltage of between about 50 to 250 volts.

At the same time, the voltage bias fed to the filament is between zero volts and about a negative 150 volts. This creates a voltage difference between the filament and the chamber walls of less then about 100 volts. The workpiece 116 voltage is simultaneously taken to about the same voltage negative as the bias on the filament. However, the applied voltages may differ from these figures depending on various factors and other conditions in the operating chamber. A potential difference is formed between the filament 113 and the chamber walls 111 equal to the bias on the filament. In addition, a potential difference is formed between the workpiece and the anode of approximately 200 volts.

When the chamber is in an operating mode including the application of biases to the various operating components, a gas to create the plasma is fed into chamber 111 through gas port 125 from gas supply 126 when valve 127 is opened. A second gas supply 128, second valve 130 and second gas port 131 can be used to supply a second gas to the chamber 111.

During operation, the cathode or filament 113 is biased negatively relative to chamber 111. At the same time the anode is biased positively relative to the walls of the chamber 111. At the same time the workpiece 116 is biased negatively with respect to the walls of chamber 111. This approach provides control of the energy of the ions reaching the workpiece 116 and reaching the walls of chamber 111. In addition, this design permits control of the properties of the film deposited on the walls of chamber 111 independently of the properties of the film deposited on workpiece 116.

In the embodiment described, if a plasma containing a hydrocarbon is used supplied for example from gas supply 126, carbon would be deposited in films of different properties on the walls of chamber 111 and on workpiece 116. The most important property in the case of DLC deposition, with respect to particle control, is the film stress. A low stress film is required on the walls of the chamber so that flaking does not occur and so that one can run the chamber for a reasonable period of time without the need for cleaning and/or creating a new vacuum environment.

At the same time there is deposited a high stressed thin film on the workpiece 116 and this acts as a protective coating for the layers below. In this embodiment the ions striking the workpiece do so with greater ion energy because of the potential difference existing between the anode of ion source 115 and the bias on workpiece 116. Ions of lower energy simultaneously strike the walls of chamber 111 because of the lower potential difference between the anode and the walls as compared to the difference between the anode and the workpiece.

For etch applications, this control scheme would allow for a reduction or elimination of etching of the walls of the chamber 111 by reducing the ion acceleration to the walls while etching on workpiece 116. Alternatively etching can be used to clean up the walls or a shield positioned within the chamber adjacent to the walls. This is done using pure argon plasmas in the chamber. For other applications fluorocarbons or chlorine containing gases may be used. It is also possible to etch using oxygen or hydrogen as the processing gas.

The pressure in the chamber for deposition is reduced at the start of the cycle or prior to flowing gas into the chamber. During the time that both gases are flowing into the system, the pressure in the chamber generally rises. The system may be operated at about a chamber pressure of between about 1 and about 5 mtorr. The system can function by depositing ions from the active gas which may comprise, for example, ethylene in the case of the deposition of carbon. The other supply may comprise, for example, argon and may be turned off using the control valve on that supply.

There are several requirements for a DLC protective overcoat for magnetic media. One is that the film be sufficiently hard that a very thin film, for example about 50 angstroms, suffices and effectively protects the media. Another requirement is that sufficiently few particles are left on the workpiece (e.g., disk) so that a low flying head will not "crash" due to collisions with particles. Operating at pressures greater than 3 mtorr, particle levels on the workpiece are reduced. This may be due to a greater probability that large electrically charged particles will undergo charge exchange and become neutralized. On the other hand, if ethylene pressures are greater than about 2.3 mtorr, the DLC film becomes softer. This may be due to the energetic ions which strike the workpiece surface transferring some of the energy to neutral ethylene molecules loosely bonded to the surface.

In order to obtain a hard film and low particle levels, an inert gas such as argon may be added to the gas within the chamber. The reduction in particle levels is due to total gas pressure, apparently regardless of the composition of the gas. However, the film properties depend only on the partial pressure of the active gas, ethylene in this case, and are independent of the partial pressure of the inert gas, in this case argon. Thus, hard DLC films are achieved by operating at a partial pressure of ethylene of about 2 mtorr and at the same time obtain low particle levels by maintaining a partial pressure of argon of 2 mtorr for a total pressure of 4 mtorr.

When both gases are flowing in a deposition mode in which carbon is to be deposited, ethylene gas will typically flow at a rate of about 14 sccm while argon will flow at a like rate but will be fed into the chamber from two sources, each providing about half the flow. Throughout the time gas is feeding into the chamber the vacuum system continues to operate.

While the invention has been shown or described in only some of its forms, it should be apparent to those skilled in the art that it is not so limited, but is susceptible to various changes without departing from the scope of the invention.

What is claimed is:

1. A system for plasma-enhanced chemical vapor deposition, comprising:
a chamber having an anode and a filament that define an ion source;
a workpiece in the chamber facing the ion source;
electrodes supporting the filament, each of the electrodes having an inner post, an outer shell, and an insulator located between the inner post and the outer shell for electrically insulating the outer shell from the inner post;
wherein the outer shell has axial pockets which have a pocket diameter that is greater than a bore diameter of the outer shells, and the insulators are located at opposite ends of the outer shell in respective ones of the axial pockets, such that proximal and distal ends of the inner posts extend axially beyond respectively ones of the insulators;

a power source for applying an electrical bias to the workpiece and to the inner posts for transmission to the filament, such that no electrical potential is applied to the outer shells; and the ion source deposits carbon film on the workpiece and on the outer shells for building carbon film on the workpiece to a desired thickness, such that a stress generated in the carbon film deposited on the outer shells is less than a stress generated in the carbon film deposited on the workpiece.

2. A system according to claim 1, wherein the insulator comprises a pair of ceramic insulators located at opposite ends of respective ones of the outer shells.

3. A system according to claim 1, further comprising caps mounted to distal ends of the electrodes, each of the caps being electrically insulated from respective ones of the distal ends by a ceramic insert located therebetween; and the insulator further comprising:

ceramic inserts located between respective ones of the caps and the distal ends of the inner posts, the ceramic inserts having tapped holes for engaging respective threads on the distal ends, and the ceramic inserts are bonded to respective ones of the caps.

4. A system according to claim 3, further comprising washers mounted to respective ones of the inner posts between the ceramic inserts and the insulators, and a lock nut located between the ceramic inserts and the washer.

5. A system according to claim 1, the insulators are axially recessed within respective ones of the axial pockets; and further comprising a lock disk mounted to respective ones of the proximal ends of the inner posts with a fastener, nuts mounted to respective ones of the distal ends of the inner posts, and radial gaps are located between and annularly circumscribe respective inner surfaces of the outer shells and respective ones of both the lock disks and the nuts.

6. A system according to claim 1, wherein the insulators provides an electrical resistance of greater than 50 ohms between respective ones of the inner posts and the outer shells.

* * * * *